United States Patent
McBride et al.

(10) Patent No.: US 7,217,578 B1
(45) Date of Patent: May 15, 2007

(54) ADVANCED PROCESS CONTROL OF THERMAL OXIDATION PROCESSES, AND SYSTEMS FOR ACCOMPLISHING SAME

(75) Inventors: Michael J. McBride, Austin, TX (US); Jesse C. Ramos, Austin, TX (US); Mark E. Culp, Austin, TX (US); Matthew Ryskoski, Kyle, TX (US); Pirainder S. Lall, Austin, TX (US)

(73) Assignee: Advanced Micro Devices, Inc., Austin, TX (US)

(*) Notice: Subject to any disclaimer, the term of this patent is extended or adjusted under 35 U.S.C. 154(b) by 260 days.

(21) Appl. No.: 10/909,497

(22) Filed: Aug. 2, 2004

(51) Int. Cl.
H01L 21/00 (2006.01)
H01L 21/469 (2006.01)

(52) U.S. Cl. .................. 438/5; 438/770; 438/795
(58) Field of Classification Search .............. None
See application file for complete search history.

(56) References Cited

U.S. PATENT DOCUMENTS

| | | | |
|---|---|---|---|
| 6,114,258 A * | 9/2000 | Miner et al. ............ | 438/787 |
| 6,352,942 B1 * | 3/2002 | Luan et al. ............ | 438/770 |
| 6,908,774 B2 * | 6/2005 | Ghyselen et al. ...... | 438/14 |
| 6,953,697 B1 * | 10/2005 | Castle et al. .......... | 438/7 |
| 2003/0045098 A1 * | 3/2003 | Verhaverbeke et al. .. | 438/689 |
| 2003/0045131 A1 * | 3/2003 | Verbeke et al. ....... | 438/795 |
| 2003/0089394 A1 * | 5/2003 | Chang-Chien et al. .. | 137/14 |
| 2004/0072450 A1 * | 4/2004 | Collins et al. ........ | 438/782 |
| 2004/0087042 A1 * | 5/2004 | Ghyselen et al. ...... | 438/5 |
| 2004/0152311 A1 * | 8/2004 | Ghyselen et al. ...... | 438/689 |
| 2006/0154383 A1 * | 7/2006 | Kannan et al. ........ | 438/5 |

* cited by examiner

Primary Examiner—David E. Graybill
(74) Attorney, Agent, or Firm—Williams, Morgan & Amerson, P.C.

(57) ABSTRACT

The present invention is generally directed to various advanced process control methodologies for thermal oxidation processes, and various systems for accomplishing same. In one illustrative embodiment, the method comprises measuring an ambient pressure of an environment external to an oxidation chamber, determining a correction factor based upon at least the measured ambient pressure, determining at least one parameter of a thermal oxidation process to be performed in the oxidation chamber based upon the determined correction factor, and performing the thermal oxidation process comprised of the determined parameter on at least one substrate positioned in the oxidation chamber.

13 Claims, 3 Drawing Sheets

ADVANCED PROCESS CONTROL OF THERMAL OXIDATION PROCESSES, AND SYSTEMS FOR ACCOMPLISHING SAME

BACKGROUND OF THE INVENTION

1. Field of the Invention

The present invention is generally related to semiconductor manufacturing, and, more particularly, to various advanced process control methodologies for thermal oxidation processes, and various systems for accomplishing same.

2. Description of the Related Art

The manufacturing of semiconductor devices may involve many process steps. For example, semiconductor fabrication typically involves processes such as deposition processes, etching processes, thermal growth processes, various heat treatment processes, ion implantation, photolithography, etc. Such processes may be performed in any of a variety of different combinations to produce semiconductor devices that are useful in a wide variety of applications.

In general, there is a constant drive within the semiconductor industry to increase the operating speed and efficiency of various integrated circuit devices, e.g., microprocessors, memory devices, and the like. This drive is fueled by consumer demands for computers and electronic devices that operate at increasingly greater speeds and efficiency. This demand for increased speed and efficiency has resulted in a continual reduction in the size of semiconductor devices, e.g., transistors, as well as the packing density of such devices on an integrated circuit device. That is, many components of a typical field effect transistor (FET), e.g., channel length, junction depths, gate insulation thickness, and the like, are reduced. For example, all other things being equal, the smaller the channel length of the transistor or the thinner the gate insulation layer, the faster the transistor will operate. Thus, there is a constant drive to reduce the size, or scale, of the components of a typical transistor to increase the overall speed of the transistor, as well as integrated circuit devices incorporating such transistors. There is also a constant demand for memory cells or devices with enhanced access times and read/write capabilities.

As a result of the rapid advance in semiconductor manufacturing technology and the performance of semiconductor devices, it is very important that manufacturing processes employed in modern semiconductor manufacturing operations enable the repeated production of semiconductor devices to very exacting dimensions and standards. Even minor variations in processing can adversely impact device performance. For example, in the context of field effect transistors, the formation of a gate electrode to the desired critical dimension is very important. If the critical dimension of the gate electrode is larger than a desired target value, then the transistor may have a lower operating speed than is desired. Conversely, if the critical dimension of the gate electrode is smaller than the target critical dimension, there may be undesirable leakage currents in excess of allowable values. Accordingly, such devices may be less than desirable for many mobile applications, i.e., laptop computers, telephones, etc.

As indicated above, thermal growth processes are employed frequently in the manufacture of semiconductor devices. For example, thermal growth processes may be performed to form a gate insulation layer on a field effect transistor, or a tunnel oxide layer on a memory cell. The formation of such layers may be critically important to the performance of such devices. This is even more true given the continual reduction in the feature size of the semiconductor devices that has occurred in recent years. For example, if the thickness of a thermally grown gate insulation layer or tunnel oxide layer varies from a target value, then the resulting device may not meet target performance characteristics established for such a device. Moreover, it should be understood that, in modern semiconductor devices, such gate insulation layers may have a thickness on the order of approximately 30–100 Å (3–10 nm). Thus, establishing process control techniques that enable a manufacturer to reliably and repeatedly reproduce thermally grown process layers to such exacting requirements is a very challenging undertaking.

The present invention is directed to various methods and systems that may solve, or at least reduce, some or all of the aforementioned problems.

SUMMARY OF THE INVENTION

The present invention is generally directed to various advanced process control methodologies for thermal oxidation processes, and various systems for accomplishing same. In one illustrative embodiment, the method comprises measuring an ambient pressure of an environment external to an oxidation chamber, determining a correction factor based upon at least the measured ambient pressure, determining at least one parameter of a thermal oxidation process to be performed in the oxidation chamber based upon the determined correction factor, and performing the thermal oxidation process comprised of the determined parameter on at least one substrate positioned in the oxidation chamber.

In another illustrative embodiment, the method comprises measuring an ambient pressure of an environment external to an oxidation chamber, comparing the measured ambient pressure to a reference pressure for the environment external to the oxidation chamber, determining a correction factor based upon the comparison of the measured ambient pressure and the reference pressure, determining at least one parameter of a thermal oxidation process to be performed in the oxidation chamber based upon the determined correction factor, and performing the thermal oxidation process comprised of the determined parameter on at least one substrate positioned in the oxidation chamber.

BRIEF DESCRIPTION OF THE DRAWINGS

The invention may be understood by reference to the following description taken in conjunction with the accompanying drawings, in which like reference numerals identify like elements, and in which.

Figure 1:
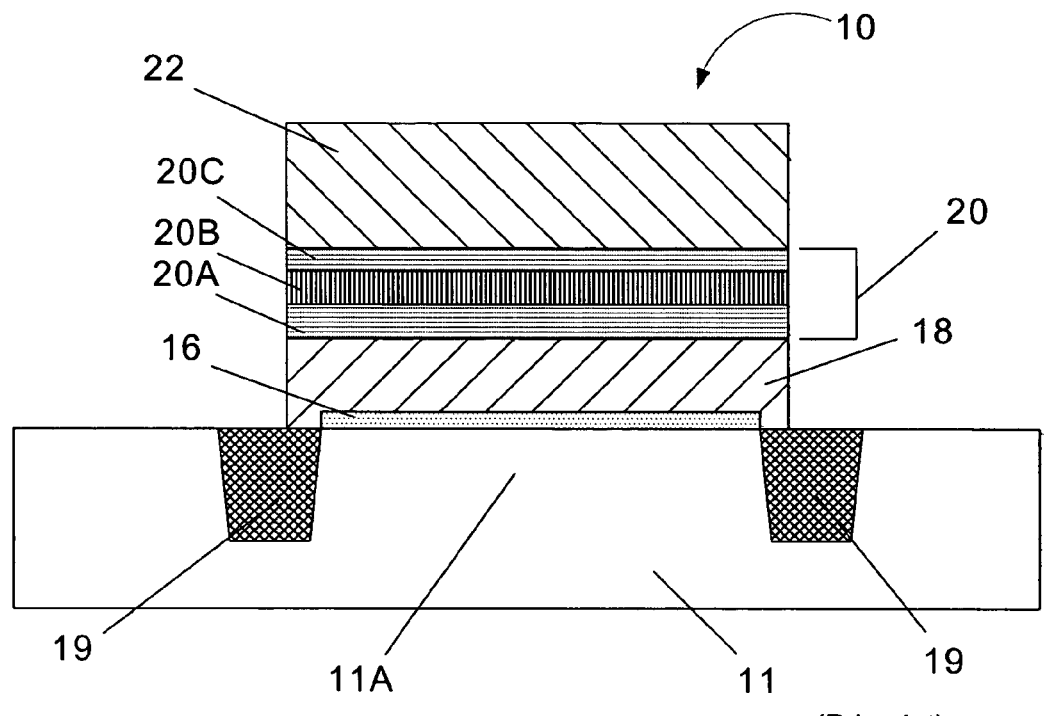
FIG. 1 is a cross-sectional depiction of a portion of an illustrative prior art memory device.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Moreover, the systems depicted herein do not include all of the various supporting utilities and equipment that may be part of a real-world functioning system. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present invention is directed to various advanced process control methodologies for thermal oxidation processes, and various systems for accomplishing same. After a complete reading of the present application that the present invention, those skilled in the art will recognize that the present invention may be employed with respect to a variety of technologies, e.g., NMOS, PMOS, CMOS, etc., and it may be employed with a variety of different types of devices. Moreover, it may be employed in the context of integrated circuit devices that may be used in a variety of consumer products, such as a personal computer, a portable computer, a mobile telephone, a digital camera, a personal digital assistant and a wireless internet appliance. Thus, the present invention should not be considered as limited to any particular type of integrated circuit device, technology or consumer product.

Figure 2:
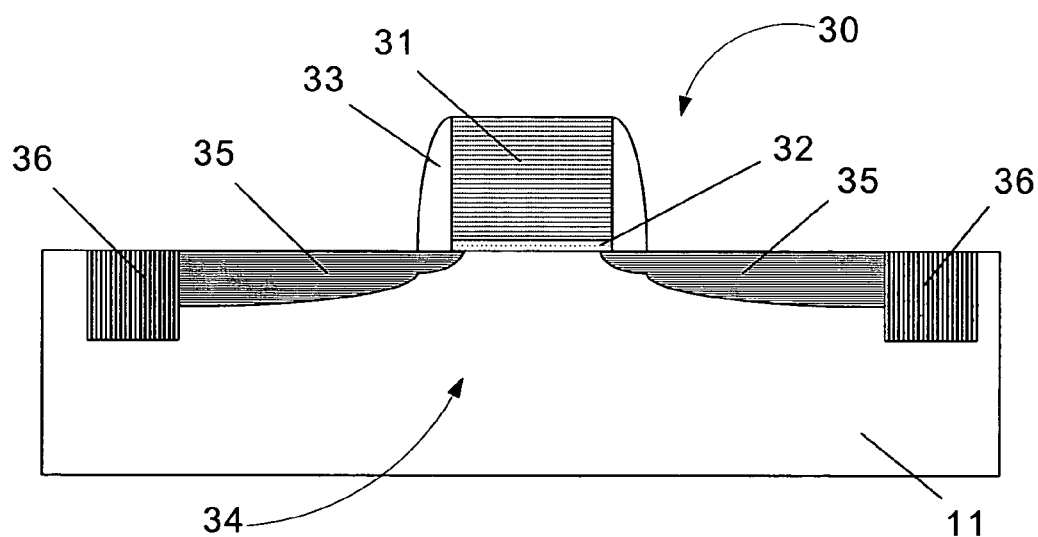
FIG. 2 is a cross-sectional depiction of an illustrative prior art field effect transistor device.

FIGS. 1 and 2 are directed to illustrative embodiments of semiconductor devices that may be formed using the methodologies described herein. FIG. 1 is a cross-sectional view of a portion of a memory cell 10. In practice, a memory array may be comprised of thousands of the memory cells 10. A plurality of field isolation regions 19, e.g., so-called field oxide regions, are formed in the substrate 11. These field isolation regions may be trench isolation regions or they may be a grown area of oxide that is formed by a LOCOS process. Each memory cell 10 is formed above an active area 11A of the substrate 11 between adjacent field isolation regions 19. The memory cell 10 is comprised of a gate insulation layer 16, which is sometimes referred to as a tunnel oxide layer, a floating gate electrode 18, a composite inter-poly insulation layer 20, and a control gate electrode 22. The composite inter-poly insulation layer 20 may be comprised of a layer of silicon dioxide 20A, a layer of silicon nitride 20B and a layer of silicon dioxide 20C. Such a combination is sometimes referred to as an oxide-nitride-oxide (ONO) layer or stack. The floating gate electrode 18 and the control gate electrode 22 may be made of, for example, polysilicon. The gate insulation layer 16 may have a thickness of approximately 100 Å±2 Å (10 nm±2 nm), and it may be formed by performing a thermal oxidation process.

FIG. 2 is a cross-sectional view depicting an illustrative field effect transistor. As shown therein, the transistor 30 is comprised of a gate insulation layer 32, a gate electrode 31, sidewall spacers 33 and source/drain regions 35. The transistor 30 is formed in an active area 34 defined in the substrate 11 between isolation regions 36. The various manufacturing steps used to form the illustrative transistor 30 depicted in FIG. 2 are well known to those of skill in the art and thus will not be repeated in any greater detail. However, the gate insulation layer 32 is typically comprised of silicon dioxide and it is formed by a thermal growth process. In some cases, the gate insulation layer 32 may have a thickness that ranges from approximately 30–100 Å (3–10 nm).

Figure 3:
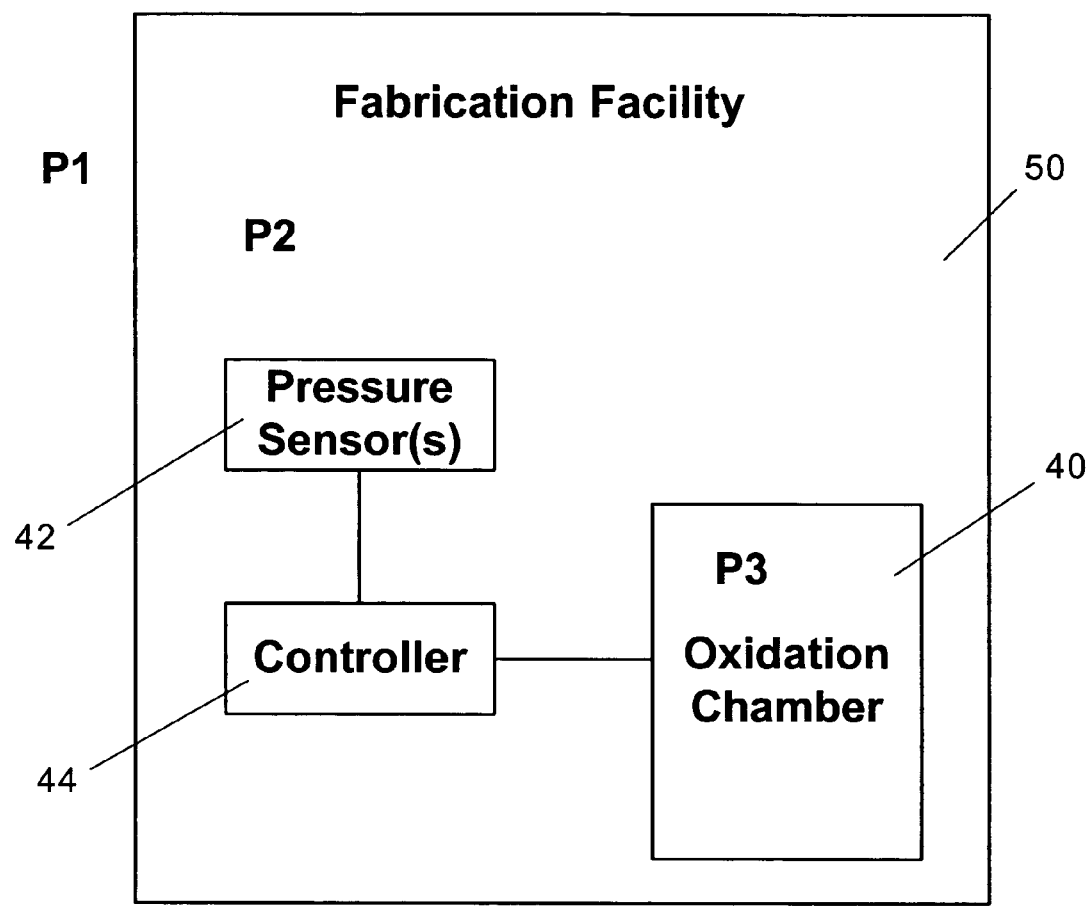
FIG. 3 is a schematic depiction of one embodiment of the present invention used to control an oxidation chamber positioned in a fabrication facility.

FIG. 3 is a schematic depiction of an illustrative fabrication facility 50 having an illustrative oxidation chamber 40 positioned therein. The present invention will now be disclosed with reference to FIG. 3. However, as those skilled in the art will recognize after a complete reading of the present application, the present invention has broad applicability and thus should not be considered as limited to any of the particular features or description set forth in FIG. 3 or any of the other figures, unless such limitations are expressly recited in the appended claims. In general, modern semiconductor manufacturing typically occurs in the fabrication facility 50 where there are strict environmental controls as to the ambient air conditions within the fabrication facility 50. One or more of the illustrative thermal oxidation chambers 40 may be positioned within the fabrication facility 50. If the facility 50 is large enough, a section or bay of the facility may contain several of the oxidation chambers 40. A schematically depicted controller 44 may be operatively coupled to the oxidation chambers 40 to control one or more operational parameters of the oxidation chambers 40. As will be recognized by those skilled in the art after a complete reading of the present application, the present invention may be employed with a variety of thermal oxidation chambers. For example, the present invention may be employed with thermal oxidation chambers manufactured by Tokyo Electron.

In general, many oxidation chambers 40 employed in many modern semiconductor fabrication facilities 50 operate by establishing a negative relative pressure differential between the pressure (P3) within the oxidation chamber 40 and the ambient pressure (P2) in the environment external to the oxidation chamber 40. In FIG. 3, the pressure "P2" refers to the ambient pressure of the environment external to the oxidation chamber 40. The pressure "P1" refers to the general atmospheric pressure of the environment external to the fabrication facility 50. The pressure "P3" refers to the pressure within the oxidation chamber 40. In general, most fabrication facilities 50 are operated such that the internal pressure (P2) within the fabrication facility 50 is greater than the pressure of the outside environment (P1). That is, the pressure P2 within the fabrication facility 50 is maintained positive relative to atmospheric pressure P1. This positive pressure differential (P2>P1) is maintained such that there will be minimal infiltration of particulates and undesirable matter from the exterior environment into the fabrication facility 50.

Normally, the pressure (P3) within the oxidation chamber 40 is maintained slightly negative with respect to the pressure (P2) within the fabrication facility 50. This negative pressure differential (P3<P2) is established such that undesirable process gases within the oxidation chamber 40 will not escape into the fabrication facility 50. There are many oxidation chambers 40 that employ this negative relative pressure differential to ensure that undesirable process gases do not escape into the fabrication facility 50. There are, however, some oxidation chambers that have a process control system that enables an operator to control the absolute pressure within the oxidation chamber to very low levels. For example, Progressive Technologies, Inc. of Tewksbury, Mass. makes a pressure control system that enables an operator to control the absolute pressure of an oxidation chamber to relatively low levels. In such systems, the absolute pressure within the oxidation chamber 40 can be set and maintained at a low enough level independent of the pressure (P2) within the fabrication facility 50. However, oxidation chambers employing such absolute process control capabilities are very expensive and not in widespread use in modern semiconductor manufacturing.

Figure 4:
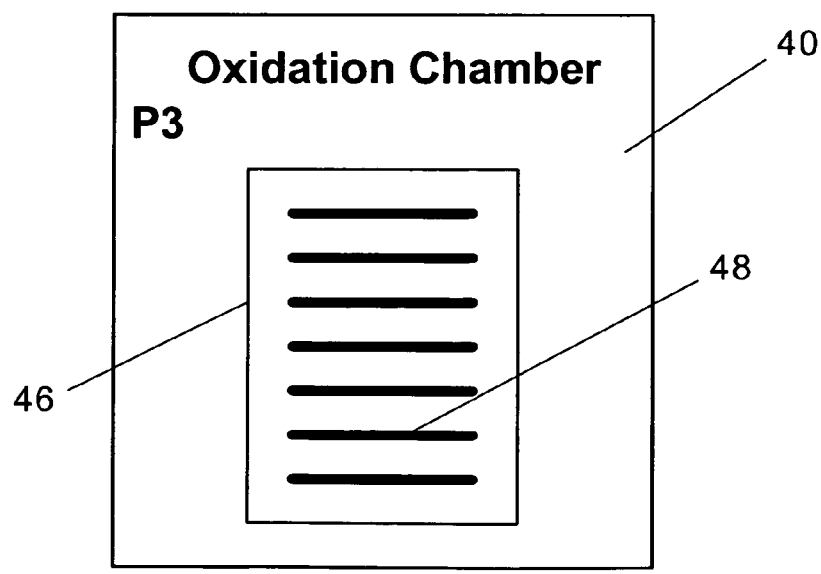
FIG. 4 is an enlarged schematic depiction of an illustrative oxidation chamber that may be controlled in accordance with one embodiment of the present invention.

FIG. 4 is an enlarged schematic view of the oxidation chamber 40. As shown therein, a plurality of substrates 48 are positioned in a carrier 46 that is positioned within the oxidation chamber 40. Of course, the present invention may be employed in the context where a variety of carriers and/or substrates may be subjected to the thermal oxidation process performed in the oxidation chamber 40. Thus, the present invention should not be considered as limited to the number of substrates positioned in the chamber 40, the orientation of the carrier 46 or chamber substrates 48 within the chamber 40, or to the types of carriers 46 employed.

In one embodiment (see FIG. 3), the present invention involves the use of one or more pressure sensors 42 (schematically depicted) to sense or measure the ambient pressure of the environment external to the oxidation chamber 40, i.e., to sense or measure the pressure P2 within the fabrication facility 50. Based upon the measured or sensed value of the pressure P2, a correction factor is established relative to a reference pressure $P_{ref}$. In some prior art systems, although the oxidation chamber 40 was always maintained at a set negative pressure differential relative to the pressure P2 within the fabrication facility 50, such systems did not account for fluctuations of the pressure P2 within the fabrication facility 50. For example, the pressure within the fabrication facility (P2) was normally set somewhat positive relative to the general atmospheric pressure (P1). Thus, variations in the atmospheric pressure (P1) would cause variations in the absolute value of the pressure (P2) within the fabrication facility 50. Such variations in the absolute value of the pressure (P2) within the fabrication facility 50 could adversely impact the ability to precisely grow process layers within the oxidation chamber 40. That is, although the oxidation chamber 40 was capable of establishing a slightly negative operating pressure differential (P3<P2), such a differential was independent of the absolute value of the pressure (P2) within the fabrication facility 50.

Failure to account for the variations in the absolute value of the pressure (P2) within the fabrication facility 50 may have an adverse impact on the ability to precisely form thermally grown layers to desired dimensions. In general, the oxidation rate of the process performed in the oxidation chamber 40 increases as the pressure (P3) within the chamber 40 increases. Conversely, the oxidation rate decreases as the pressure (P3) within the chamber 40 decreases. Thus, in oxidation chambers 40 where the pressure (P3) within the chamber 40 is set slightly negative relative to the pressure (P2), the absolute value of the pressure (P3) within the chamber 40 varies depending upon the absolute value of the pressure (P2), which changes depending upon the absolute value of the pressure (P1).

Given that the process layers formed within the oxidation chamber 40 may have a thickness on the order of approximately 30–100 Å, with a tolerance of approximately ±2 Å or less, very precise control of the oxidation rate and the oxidation process is very important. Small variations in the pressure (P2) within the fabrication facility 50 cause variations in the thickness of a process layer formed in the oxidation chamber 40. For example, variations of approximately 20 Torr, e.g., from approximately 740–760 Torr, in the absolute value of the pressure (P2) within the fabrication facility 50 may result in a thickness differential (Δt) of approximately 0.8–0.9 Å for a thermally grown layer of silicon dioxide having a target thickness of approximately 100 Å. This occurs because the absolute value of the pressure (P3) within the oxidation chamber 40 is established relative to the pressure (P2) of the environment external to the oxidation chamber, e.g., the pressure within the fabrication facility 50. Thus, by failing to account for the variations in the absolute value of the pressure (P2) within the fabrication facility 50, unwanted errors can be introduced into the manufacture of thermally grown process layers.

To that end, the present invention involves sensing the pressure P2 within the fabrication facility 50 and establishing a correction factor that may be used to adjust one or more parameters of the thermal oxidation process to be performed in the oxidation chamber 40. For example, based upon the measured values of the pressure P2, a correction factor may be established to increase or decrease the duration of at least a portion of the thermal oxidation process performed in the oxidation chamber 40 and/or a temperature of at least a portion of the oxidation process performed in the oxidation chamber 40. By employing this correction factor, more precise control of the thermal oxidation processes may be achieved, thereby resulting in better quality control of layers formed in the oxidation chamber 40.

In one illustrative embodiment, the controller 44 receives input from the various pressure sensors 42 and determines the correction factor. Moreover, the controller 44 may then modify or adjust one or more parameters of the thermal oxidation process to be performed in the oxidation chamber 40 based upon this correction factor. One or more substrates may then be processed in the oxidation chamber 40. For example, based upon empirical data, a chart or database may be created in which the duration of at least a portion of the thermal oxidation process performed in the oxidation chamber 40 is increased or decreased based upon the measured value of the pressure (P2) relative to a reference pressure ($P_{ref}$). The reference pressure ($P_{ref}$) may be established over time as the pressure (P2) that normally exists in the fabrication facility 50. Alternatively, the reference pressure ($P_{ref}$) may be set at an arbitrary value. Various parameters, e.g., duration, temperature, temperature ramps, etc., of various process recipes that may be performed in the oxidation chamber 40 may be established based upon this reference pressure ($P_{ref}$). According to one aspect of the present invention, a correction factor may be determined based upon a comparison of the measured pressure (P2) and this reference pressure ($P_{ref}$). If the measured pressure P2 within the facility 50 is determined to be equal to the reference pressure ($P_{ref}$), then a selected process recipe may be performed in the oxidation chamber 40 without adjusting or determining any parameters of the process recipe. However, if the measured pressure (P2) within the fabrication facility 50 is determined to vary from the reference pressure ($P_{ref}$), then one or more parameters of the basic process recipe to be performed in the oxidation chamber 40 may be adjusted or determined. For example, if the measured pressure (P2) is greater than the reference pressure ($P_{ref}$), then the duration of the thermal growth process performed in the oxidation chamber 40 may be decreased. Conversely, if the measured pressure (P2) is less than the reference pressure ($P_{ref}$), then the duration of the thermal oxidation process may be increased. Once this correction factor is determined, the thermal oxidation process, comprised of the determined parameter, may then be performed in the oxidation chamber 40 on one or more substrates positioned therein. Of course, if desired, such corrections or adjustments may not be made unless the measured pressure (P2) varies from the reference pressure ($P_{ref}$) by more than a preselected allowable limit.

The methodology described herein may be performed as often as desired. In one illustrative embodiment, the methodologies described herein may be performed prior to positioning various substrates in the oxidation chamber 40. Alternatively, the methodologies described herein may be performed on a scheduled basis, i.e., weekly, monthly, etc. Of course, the methodologies described herein may be performed at any time that is desired by the appropriate process engineer responsible for operation of the oxidation chamber 40.

In the illustrated embodiments, the controller 44 is a computer programmed with software to implement the functions described herein. Moreover, the functions described for the controller 44 may be performed by one or more controllers spread through the system. For example, the controller 44 may be a fab level controller that is used to control processing operations throughout all or a portion of a semiconductor manufacturing facility. Alternatively, the controller 44 may be a lower level computer that controls only portions or cells of the manufacturing facility. Moreover, the controller 44 may be a stand-alone device, or it may reside on the oxidation chamber 40, depending upon the particular application. However, as will be appreciated by those of ordinary skill in the art, a hardware controller (not shown) designed to implement the particular functions may also be used.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the controller 44, as described, is the Catalyst system formerly offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

Figure 5:
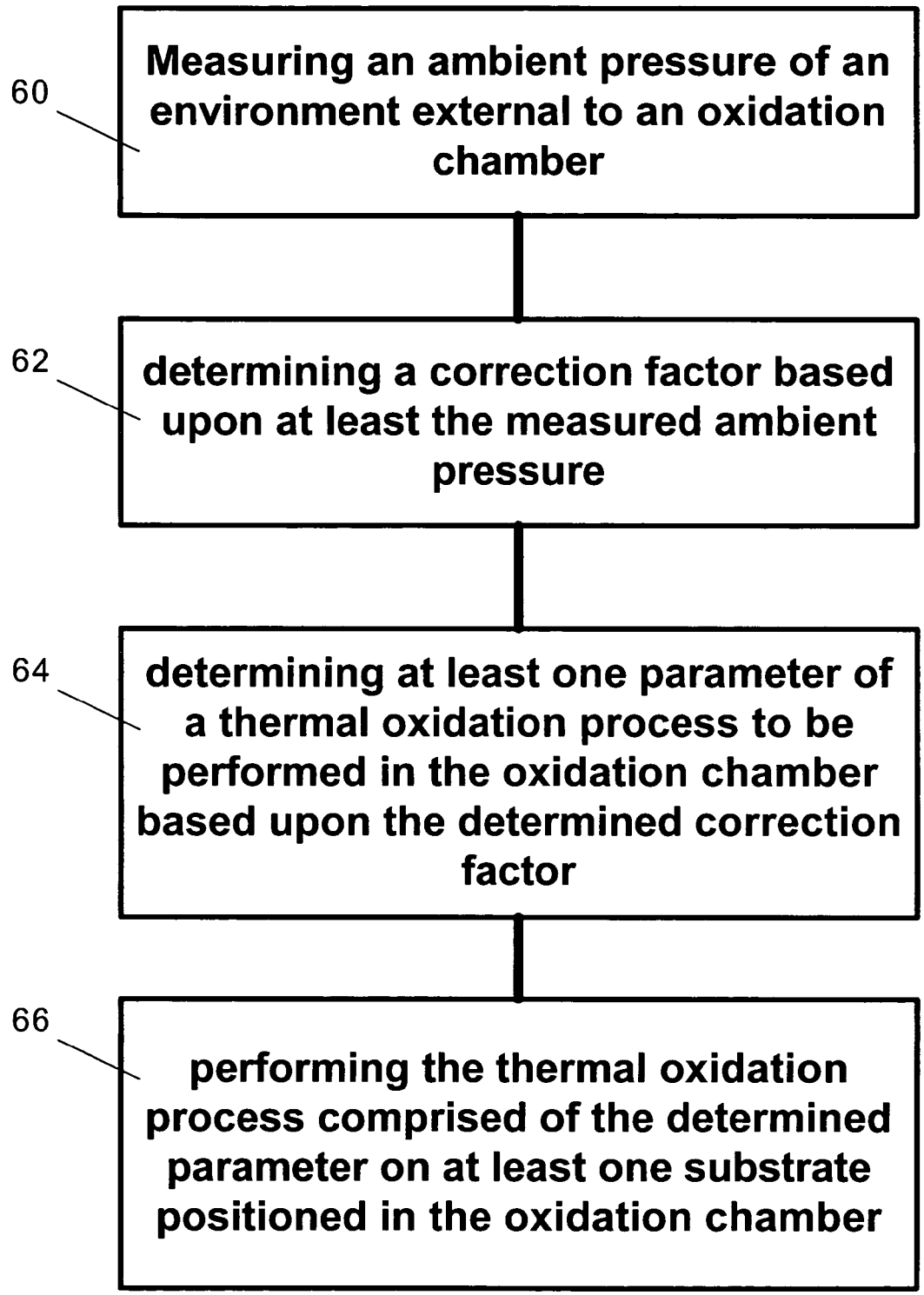
FIG. 5 is a depiction of one illustrative embodiment of the present invention in flowchart form.

The present invention is generally directed to various advanced process control methodologies for thermal oxidation processes, and various systems for accomplishing same. One illustrative embodiment of a method in accordance with the present invention is depicted in flowchart form in FIG. 5. As shown therein, the method comprises measuring an ambient pressure of an environment external to an oxidation chamber, as indicated in block 60, and determining a correction factor based upon at least the measured ambient pressure, as set forth in block 62. The method further comprises determining at least one parameter of a thermal oxidation process to be performed in the oxidation chamber based upon the determined correction factor, as indicated in block 64, and performing the thermal oxidation process comprised of the determined parameter on at least one substrate positioned in the oxidation chamber, as set forth in block 66.

In another illustrative embodiment, the method comprises measuring an ambient pressure of an environment external to an oxidation chamber, comparing the measured ambient pressure to a reference pressure for the environment external to the oxidation chamber, determining a correction factor based upon the comparison of the measured ambient pressure and the reference pressure, determining at least one parameter of a thermal oxidation process to be performed in the oxidation chamber based upon the determined correction factor, and performing the thermal oxidation process comprised of the determined parameter on at least one substrate positioned in the oxidation chamber.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
   measuring an ambient pressure of an environment external to an oxidation chamber;
   comparing said measured ambient pressure to a reference pressure for said environment external to said oxidation chamber;
   determining a correction factor based upon said comparison of said measured ambient pressure and said reference pressure;
   determining at least one parameter of a thermal oxidation process to be performed in said oxidation chamber based upon said determined correction factor; and
   performing said thermal oxidation process comprised of said determined parameter on at least one substrate positioned in said oxidation chamber.

2. The method of claim 1, wherein said at least one parameter of said thermal oxidation process comprises at least one of a duration of at least a portion of said thermal oxidation process and a temperature of said thermal oxidation process.

3. The method of claim 1, wherein said measured ambient pressure is provided to a controller that determines said correction factor.

4. The method of claim 1, further comprising decreasing a duration of at least a portion of said thermal oxidation process responsive to determining said measured ambient pressure is greater than said reference pressure.

5. The method of claim 1, further comprising increasing a duration of at least a portion of said thermal oxidation process responsive to determining said measured ambient pressure is less than said reference pressure.

6. The method of claim 1, wherein said thermal oxidation process is performed to form a tunnel oxide layer on a plurality of memory devices.

7. The method of claim 1, wherein said thermal oxidation process is performed to form a gate insulation layer on a plurality of field effect transistors.

8. The method of claim 1, wherein said thermal oxidation chamber operates based upon a selected negative pressure differential between said ambient pressure and a pressure within said oxidation chamber.

9. The method of claim 1, wherein said ambient pressure of said external environment is an ambient pressure existing within a semiconductor fabrication facility.

10. The method of claim 1, wherein the steps recited in claim 1 are performed prior to positioning a plurality of substrates in said oxidation chamber.

11. The method of claim 1, further comprising performing said thermal oxidation process comprised of said determined parameter on additional substrates positioned in said oxidation chamber.

12. The method of claim 1, further comprising determining if said measured ambient pressure varies from said reference pressure by more than a preselected allowable limit.

13. The method of claim 1, wherein measuring said ambient pressure comprises sensing said ambient pressure using at least one pressure sensor positioned in said environment external to said oxidation chamber.

* * * * *